(12) United States Patent
Komeda (10) Patent No.: US 6,711,186 B2
(45) Date of Patent: Mar. 23, 2004

(54) OPTICAL MODULE

(75) Inventor: Ryuji Komeda, Kashihara (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 10/113,588

(22) Filed: Mar. 28, 2002

(65) Prior Publication Data

US 2002/0141462 A1 Oct. 3, 2002

(30) Foreign Application Priority Data

Mar. 30, 2001 (JP) ........................................ 2001-099412
Oct. 30, 2001 (JP) ........................................ 2001-332132

(51) Int. Cl.⁷ ................................................. H01S 3/13
(52) U.S. Cl. ...................................... 372/29.02; 385/31
(58) Field of Search ................... 372/29.02; 385/31.38, 385/137; 257/80; 359/282; 438/43

(56) References Cited

U.S. PATENT DOCUMENTS

| | | | | |
|---|---|---|---|---|
| 4,758,535 A | * | 7/1988 | Sakakibara et al. | 438/43 |
| 5,099,357 A | * | 3/1992 | Yokogawa et al. | 359/282 |
| 5,163,113 A | * | 11/1992 | Melman | 385/31 |
| 5,522,000 A | * | 5/1996 | Ayliffe et al. | 385/88 |
| 5,970,200 A | * | 10/1999 | Takikawa et al. | 385/137 |
| 6,081,638 A | * | 6/2000 | Zhou | 385/31 |
| 6,137,121 A | * | 10/2000 | Yamamoto et al. | 257/80 |
| 6,205,274 B1 | * | 3/2001 | Zhou | 385/38 |
| 6,490,392 B1 | * | 12/2002 | Munekata et al. | 385/31 |

* cited by examiner

*Primary Examiner*—Paul Ip
(74) *Attorney, Agent, or Firm*—Hogan & Hartson (57) ABSTRACT

The present invention relates to an optical module for light path conversion, which is used in the fields of optical communications, optical information processing and the like. The optical module of the present invention comprises a surface light emitting element and a light path converting reflective body formed from single-crystal silicon, which has an inclined face on which a light-reflecting film is formed, and is constructed by causing the light that is emitted from the surface light emitting element to be subjected to a light path conversion by the inclined face.

7 Claims, 8 Drawing Sheets

OPTICAL MODULE

BACKGROUND OF THE INVENTION

1. Field of the Invention

The present invention relates to an optical module for light path conversion which is used in the fields of optical communication, optical information processing and the like.

2. Description of the Related Art

In recent years, as the practical adaptation of optical communications systems and optical information processing systems has progressed, a demand has arisen for systems that have an even higher degree of function. Optical integrated circuits in which optical functional elements are integrated are indispensable for the realization of such systems, and such circuits have been widely investigated.

Especially in regard to techniques for connecting optical semiconductor elements with optical fibers, the active alignment method has commonly been used in the past for optical connections between optical semiconductor elements and optical fibers. This active alignment method is a method in which optical connections between optical fibers and optical semiconductor elements are made by causing the element to emit light or causing light to be incident on one end of the element waveguide, then disposing the optical fiber at the emitting end, and finely adjusting the position of the optical fiber so that the quantity of light received by the optical fiber reaches a maximum.

In this active alignment method, it is necessary to cause the element itself to emit light, or to cause light to be incident from one end of the element waveguide. In this method furthermore, time is required in order to center the optical axis for each individual element involved; accordingly, this method suffers from inconveniences such as increased cost and the like.

In order to solve this problem, passive alignment techniques have been actively investigated in recent years. Such passive alignment techniques are techniques in which optical connections are achieved by mechanically adjusting the relative positions of the optical semiconductor element with respect to optical fibers at high precision. In the case of such techniques, the positions of the optical semiconductor element and optical fiber are determined only with mechanical precision; accordingly, there is no need to cause the optical semiconductor element to emit light, or to caused light to be incident on the optical semiconductor element. Thus, passive alignment techniques may be said to be an extension of conventional electrical element mounting techniques; the effect in terms of mass production is extremely great, and such techniques are becoming essential in order to lower the cost of optical modules. Furthermore, passive alignment techniques are indispensable for realizing surface-mounted type optical transmission modules, for increasing the speed of optical modules, and for reducing the size and height of optical modules.

In recent years, meanwhile, the application and development of surface emitting lasers (vertical cavity surface emitting lasers; hereafter abbreviated to "VCSEL") have been widely discussed. Compared to conventional Fabry-Perot lasers which are end-surface resonator type lasers, such VCSEL have superior special features such as a small operating current and superior temperature characteristics; accordingly, these lasers have attracted attention as the next generation of light sources for use in optical communications.

In consideration of such trends, it is very natural that efforts are now being made to apply passive alignment techniques to VCSELs.

However, three major problems have been encountered in realizing optical modules with surface-mounted VCSEL.

The first problem is that since the mounting surface of a VCSEL and the direction of light emission of a VCSEL are in a mutually perpendicular relationship, special devices must be used when a VCSEL and optical fiber are optically connected. Since a VCSEL is a surface-mounted type device, the direction of light emission is the normal direction with respect to the element substrate. Since the electrodes that supply the current are generally formed on the surface of the substrate, light rays are emitted in the normal direction with respect to the surface of the mounting substrate is the electrodes are connected to the electrical connection parts on the surface of the mounting substrate. Specifically, the direction of travel of the light rays and the mounting surface are in a perpendicular positional relationship. In conventional end-surface emitting lasers, there is no need to give any consideration to such a problem. Ordinarily, the resonator is formed parallel to the mounting surface, so that the direction of light emission in a conventional end-surface emitting laser is the direction of the resonator. As a result, the emitted light is emitted parallel to the mounting surface. Accordingly, the emitted light from the laser diode can easily be caused to be incident on an optical fiber by positioning the optical fiber on one end surface of the resonator.

As a result of the above facts, a method in which (for example) an inclined reflective face is formed on the surface layer of the mounting substrate, and the light path of the emitted light is bent by this reflective face so that the emitted light is caused to be incident on an optical fiber disposed in a predetermined position, or a device known as a chip carrier which realizes an optical connection by mounting the VCSEL on one surface of a rectangular-solid block, and causing the incident end surface of the optical fiber and the emitting end surface of the VCSEL to face each other, must be used in order to cause the emitted light from the VCSEL to be incident on an optical fiber.

The second problem is that there are no effective means for constantly monitoring the optical output power of a VCSEL. In semiconductor lasers, as represented by VCSEL, the operating current value of the laser and the differential light emission efficiency fluctuate according to the ambient temperature environment and the like. The differential light emission efficiency is the ratio of the intensity of the optical output power to the injected current. Compared to conventional end-surface emission type elements, a VCSEL has the special features of stability with respect to temperature and superior long-term reliability; in some cases, however, monitoring of the intensity of the emitted light is necessary because of fluctuations in the external environment, deterioration over time or the like.

A method in which (for example) the intensity of the emitted light is monitored by installing a photodiode between the emitting end surface of the VCSEL and the incident end surface of the optical fiber, or by installing a half-mirror between these two end surfaces, is immediately conceivable as a method of solving the two problems mentioned above, constantly monitoring the intensity of the emitted light of the VCSEL, and realizing a surface-mounted type optical module. However, since the gap between these two end surfaces is approximately several microns to several hundred microns, such a method is not realistic.

Meanwhile, an example of a conventional optical module is disclosed in Japanese Patent Application Laid-Open No. 2000-502819 as a proposal regarding the two problems mentioned above. This example is a method in which a VCSEL and a photodiode are disposed on the surface of a mounting substrate so that the light emitting end surfaces or light receiving end surfaces face in the normal direction of the mounting substrate, a reflective element which has an optical coupling element that focuses the emitted light and causes this light to be incident on an optical fiber is provided, and the intensity of the emitted light of the VCSEL is monitored by causing a portion of the emitted light to be reflected by the reflective element, and detecting this light with the photodiode.

In the case of this method, however, constituent parts such as a focusing element, reflective element or the like are required; accordingly, not only is the cost increased, but a coaxial type optical module must be formed in order to realize this structure, so that the realization of a surface-mounted type optical module using a VCSEL is difficult.

Furthermore, an example of a conventional optical module is disclosed in U.S. Pat. No. 6,081,638. This example is a surface-mounted type system in which light path conversion is accomplished by reflecting the emitted light from the VCSEL by means of the tip end surface of an optical fiber worked into an inclined shape, or a semi-transparent reflective surface, and simultaneously receiving a portion of the transmitted light by means of a photodiode.

In the case of this system, however, it is necessary to polish the end surface of the optical fiber into an inclined surface; accordingly, the cost is increased. Furthermore, there are other practical problems such as the need to adjust the direction of rotation of the optical fiber axis in order to eliminate cylindrical symmetry of the optical fiber.

The third problem is that the mounting precision of a VCSEL is poor. In an end-surface emission type laser module, the mounting substrate and the surface of the active layer of the laser diode are caused to face each other, and the relative positions of both parts are determined by means of alignment marks formed on the respective surfaces. A high-precision V groove is formed beforehand in the surface layer of the mounting substrate using a silicon anisotropic etching technique or the like, and high-precision positioning of the laser diode and optical fiber is realized by disposing the optical fiber on this V groove.

However, in the case of a VCSEL, the mounting surface and the direction of the emitted light are perpendicular. As a result, if mounting is performed with the mounting substrate and the light emitting point of the VCSEL facing each other, the path of the emitted light is blocked. Accordingly, the abovementioned mounting method is not suitable.

In light of the above facts, a method in which the back surface of the VCSEL is caused to face the mounting substrate, and positioning is performed using the back surface electrodes or back surface element shape of the VCSEL as a reference might also be conceived; however, such positioning cannot be accurately performed with respect to the position of the light emitting point of the VCSEL, and this has a great effect on the mounting precision. This third problem is also encountered in the above-mentioned U.S. Pat. No. 6,081,638 relating to a surface-mounted type optical module using a VCSEL.

Thus, in the past, it has been impossible to achieve a simultaneous solution of the three problems mentioned above, regardless of the technique used.

SUMMARY OF THE INVENTION

It is an object of the present invention to provide an optical module which simultaneously solves the three problems mentioned above, and which also has a simple structure.

This object is achieved by means of an optical module which comprises a surface light emitting element and a light path converting reflective body that has an inclined face on which a light-reflecting film is formed, and that consists of single-crystal silicon, wherein the light that is emitted from the surface light emitting element is subjected to light path conversion by the inclined face.

These and other objects, features, aspects, and advantages of the present invention will become more apparent from the following detailed description of the preferred embodiments/examples with reference to the accompanying drawings.

DESCRIPTION OF THE PREFERRED EMBODIMENTS

Embodiments of the present invention will be described in detail below with reference to figures in which the embodiments are illustrated in model form.

Figure 1:
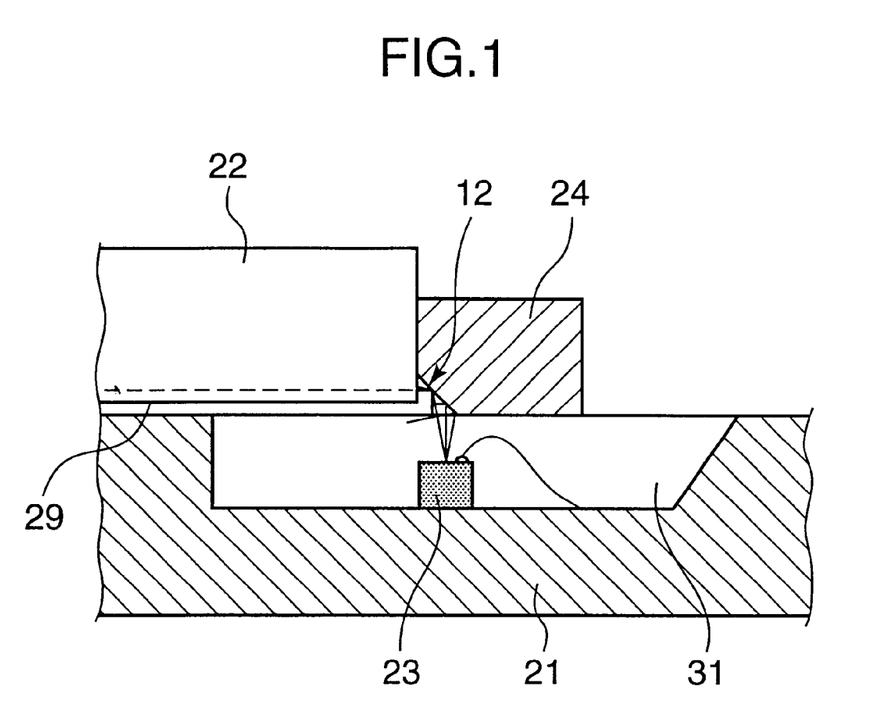
FIG. 1 is a sectional view which illustrates in model form the method that is used to form an optical connection between the VCSEL and the optical fiber.

First, the conditions of the optical connection between the VCSEL and optical fiber in the present embodiment will be described with reference to FIG. 1, in which this embodiment is shown in a sectional view.

The emitted light from the VCSEL 23 that is disposed on the VCSEL mounting substrate 21 is reflected by a light-reflecting film (reflective mirror film) 12 that is formed on the inclined face of a light path converting reflective body 24 that has the form of a prism, so that this light is caused to be incident on an optical fiber 29. A light-reflecting film is deposited and formed by a method that will be described later as the light-reflecting film 12, so that the emitted light from the VCSEL 23 can be effectively reflected. The light path converting reflective body 24 is a separate body from the VCSEL mounting substrate 21, and is surface-mounted on the VCSEL mounting substrate 21.

The VCSEL 23 and light path converting reflective body 24 may also be disposed and mounted on the same plane; however, in order to prevent mechanical interference as far as possible, ensure a geometrical degree of freedom and make the light path length as short as possible, a structure in which a VCSEL mounting groove 31 is formed, and the VCSEL 23 is disposed below the light path converting reflective body 24, is effective. The optical fiber 29 which is a light-transmitting body is accurately positioned by means of a mounting groove with a cross-sectional V shape that is formed in the optical fiber mounting substrate 22.

Next, the light path converting reflective body 24 will be described in detail with reference to FIG. 2. The light path converting reflective body 24 is manufactured from a wafer formed from single-crystal silicon or the like that can be anisotropically etched. As is shown in FIG. 3, for example, the single-crystal silicon wafer 11 is a wafer which has a face whose face orientation is inclined by $(54.7-\theta)°$ from the (100) plane, or a face that is equivalent to such a face. Here, 54.7° is the inclined-face angle that is formed by the principal face of the silicon wafer 11 when the {100} plane equivalent to the (100) plane is subjected to anisotropic etching.

Figure 2A:
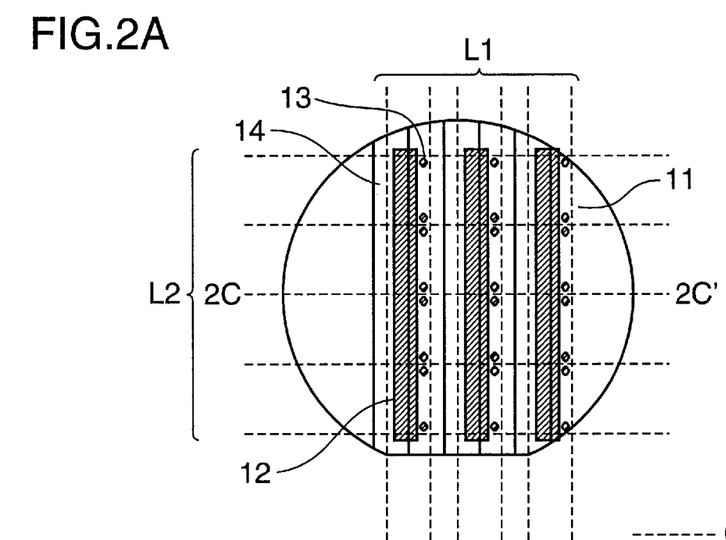
FIG. 2A shows a plan view and sectional view which illustrate in model form the conditions of manufacture of the light path converting reflective body in the present embodiment.
Figure 2B:
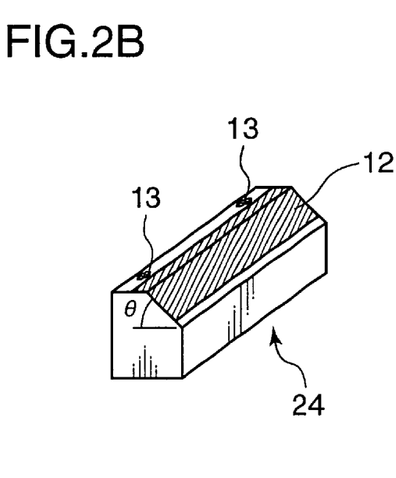
FIG. 2B is a perspective view which illustrates in model form the light path converting reflective body in the present embodiment.
Figure 2C:
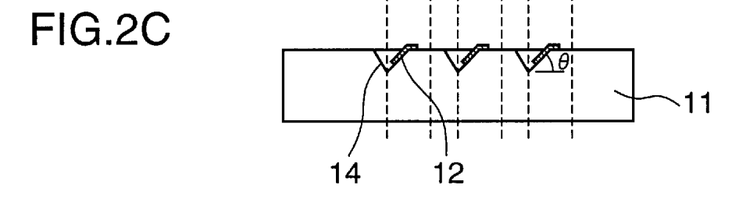
FIG. 2C is a sectional view along line 2C–2C' in FIG. 2A.
Figure 3:
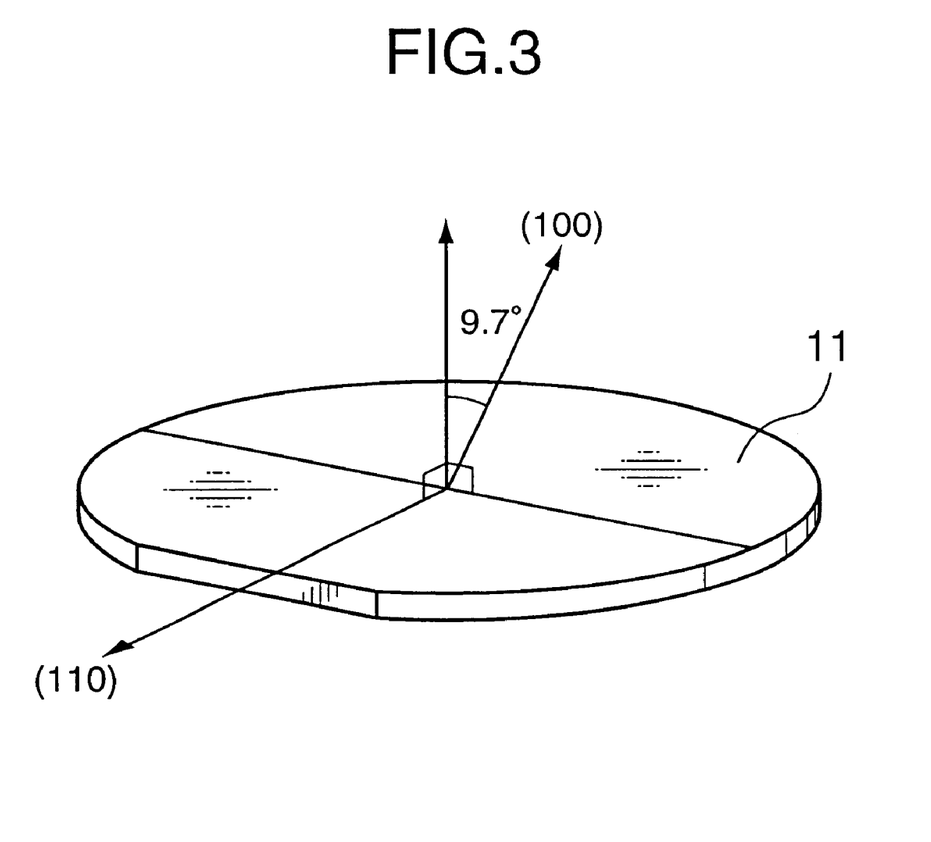
FIG. 3 is a perspective view which illustrates the substrate used to manufacture the light path converting reflective body in the present embodiment.

$\theta$ in FIG. 2 is this inclined-face angle. Specifically, in order to achieve a 90° conversion of the light path, it is necessary to set the inclined-face angle $\theta$ at 45°. In this case, the inclination of the face orientation of the silicon wafer 11 is 9.7°. Considering the numerical aperture of the optical fiber, it is desirable that the range of the inclination of the face orientation be approximately 9.7°±5° in order to cause effective incidence of the emitted light from the VCSEL 23 on the optical fiber.

The V grooves 14 formed in the silicon wafer 11 shown in FIGS. 2A and 2C are formed rectilinearly along the <110> direction of the silicon wafer 11 shown in FIG. 3. The formation of the V grooves 14 shown in FIGS. 2A and 2C is accomplished using a photolithographic technique or a silicon single crystal anisotropic etching technique.

Following the formation of these V grooves 14, a metal thin film is formed on the inclined faces of the V grooves 14 in order to form a light-reflecting film 12. Au, which has a high reflectivity, is ideal as the uppermost layer of the metal thin film; however, some other material that has a metallic luster may also be used. The metal thin film is formed as a multi-layer thin film formed from a plurality of different materials. In order to achieve effective formation of the metal film of the uppermost layer on the silicon substrate, an underlying metal multi-layer film and a silicon oxide film ($SiO_2$) are installed between the metal thin film of the uppermost layer and the silicon substrate. For example, in cases where the film of the uppermost layer consists of Au, Pt/Ti, Cr, Ni/Ti or the like (this means that the film may consist of Pt/Ti, a multi-layer film of Cr, or Ni/Ti) is effective as the underlying metal multi-layer film. A thickness of approximately several thousand angstroms to several microns is appropriate as the thickness of the light-reflecting film 12 (including the underlying metal). Furthermore, the film of the uppermost layer is not limited to Au; it is sufficient if a material that has a metallic luster is used, and this material may be appropriately altered.

Furthermore, a dielectric multi-layer film or the like may also be used as this light-reflecting film. Furthermore, even a silicon face with a mirror surface can be used as a reflective body without the particular formation of a film; however, consideration must be given to the fact that the reflectivity varies according to the direction of polarization of the incident light. In the figures, 13 indicates positioning markers that are used to achieve accurate positioning of the light path converting reflective body 24 on the surface of the mounting substrate (described later).

In cases where these positioning markers 13 are manufactured from a metal thin film pattern, the positioning markers 13 can be formed at the same time as the formation of the light-reflecting film 12. Furthermore, in cases where the markers are formed by a silicon etching pattern, the markers 13 can be formed at the same time as the V grooves 14. Following the formation of the light-reflecting film 12, positioning markers 13 and V grooves 14, the silicon wafer 11 is cut at specified positions (longitudinal cutting lines L1 and lateral cutting lines L2), so that the wafer is split into individual reflective mirror bodies, thus completing [individual examples of] the light path converting reflective body 24 shown in FIG. 2B.

Next, the mounting structure of the light path converting reflective body 24 thus manufactured, and an embodiment of an optical module using this mounting structure, will be described in detail.

Figure 4:
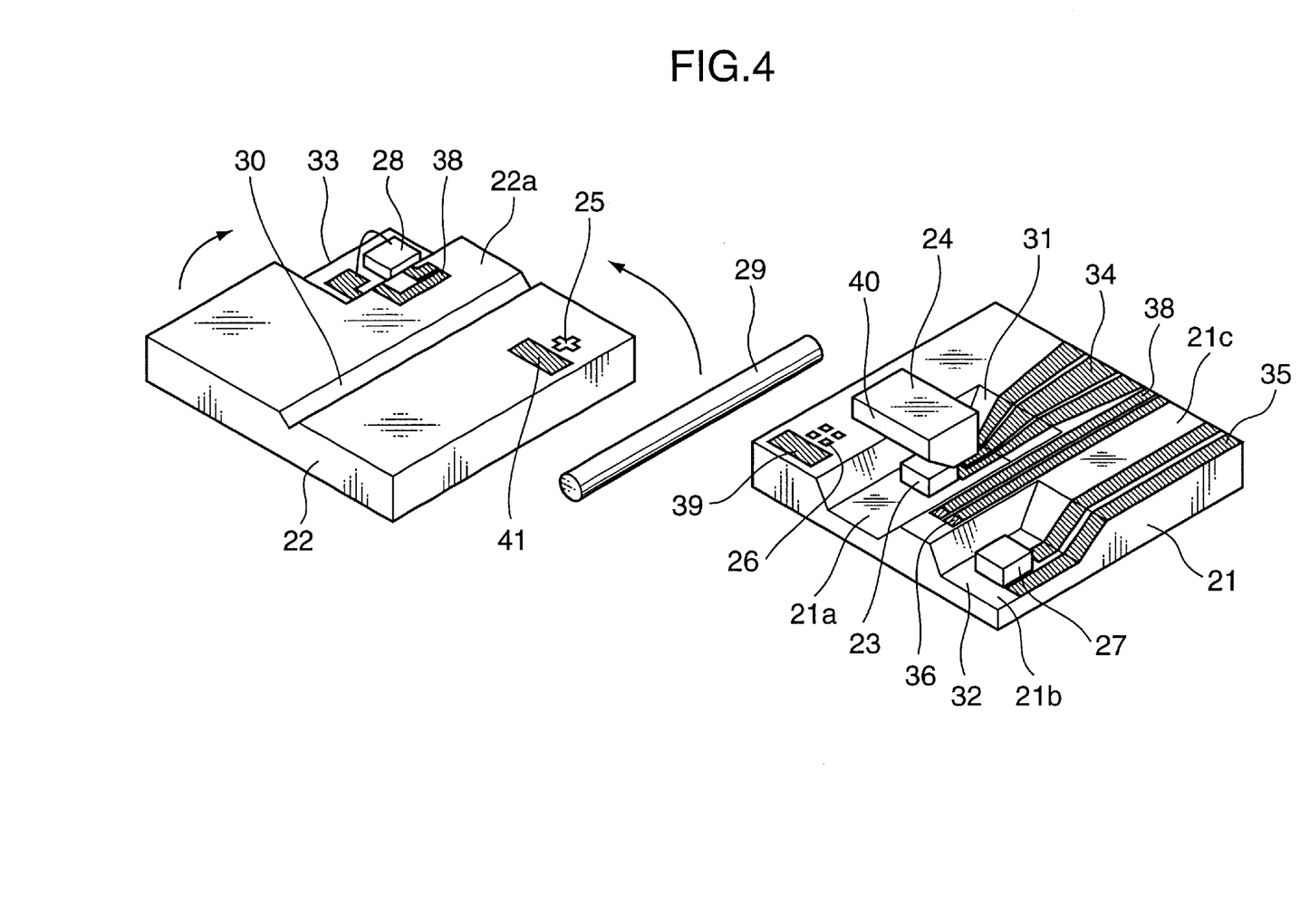
FIG. 4 is an exploded perspective view which illustrates in model form the mounting structure of the light path converting reflective body and the optical module in the present embodiment.

In FIG. 4, 21 indicates a VCSEL mounting substrate (lower substrate) on which low-position surfaces 21a and 21b and a high-position surface 21c that have a difference in height are formed. A trapezoidal groove 31 (with a trapezoidal cross-sectional shape) that is used to mount the VCSEL, and a trapezoidal groove 32 that is used to mount another VCSEL used exclusively for the monitoring of the intensity of the emitted light, are formed side by side in the surface of the VCSEL mounting substrate 21. Signal electrodes 34 which run from the bottom part of the trapezoidal groove 31 used to mount the VCSEL to the uppermost surface of the substrate 21, and power supply electrodes 35 which run from the groove 32 to the uppermost surface of the substrate 21, are formed on the surface layer of the VCSEL mounting substrate 21. 26 in FIG. 4 indicates positioning markers composed of metal thin films or of V grooves formed by etching. Furthermore, a thin film pattern 39 used for joining is formed in close proximity to these positioning markers 26.

22 in FIG. 4 indicates an optical fiber mounting substrate (upper substrate); a trapezoidal groove 33 used to mount a photodiode used for monitoring of the intensity of he emitted light is formed in this optical fiber mounting substrate 22. Output light monitoring signal electrodes 38 are formed from this photodiode mounting trapezoidal groove 33 to the uppermost-layer surface 22a of the substrate 22. A positioning marker 25 and a metal thin film pattern 41 used for joining are formed in close proximity to each other on the surface layer of the substrate 22; furthermore, a V groove 20 used to mount the optical fiber is also formed in the substrate 22.

24 indicates a light path converting reflective body, and 29 indicates an optical fiber (light-transmitting body). 36 indicates a thin film solder pattern; this is installed for the purpose of electrically connecting both of the output light monitoring signal electrodes 38 installed on the VCSEL mounting substrate 21 and the optical fiber mounting substrate 22 when the optical fiber mounting substrate,22 is mounted on the VCSEL mounting substrate 21 as described below.

Finally, the VCSEL 23 and the VCSEL 27 used for the monitoring of the intensity of the emitted light are mounted on the VCSEL mounting substrate 21 using the positioning markers 26. Positioning of both parts during this mounting is accomplished using both the outer edge of the undersurface of the VCSEL 23 or VCSEL 27 (used for monitoring of the intensity of the emitted light) and the positioning markers 26 as a reference; however, because of chipping or the like, the utilization of the outer edge as a positional reference marker tends to be inaccurate. On the other hand, in the mounting process in this stage, there is no need for an extremely high degree of precision; a precision of several tens of microns to 100 microns in the fit in the trapezoidal grooves 31 and 32 used for mounting is sufficient. For example, the VCSEL mounting is accomplished as follows: specifically, the VCSEL 23 and VCSEL 27 are mounted in close contact to thin film solder (not shown in the figures) formed on the surface of the mounting substrate 21, and are joined and fastened in place by (for example) heating and melting the solder, and then cooling the solder. Next, the VCSEL 23 and VCSEL 27 fastened to the surface of the VCSEL mounting substrate 21 are electrically connected by conductive wires such as Au wires or the like to the electrodes 34 and 35.

Next, the light path converting reflective body 24 is accurately aligned with the light emitting point of the VCSEL 23 (with a precision of 1 to several microns) using positioning markers (not shown in the figures) formed on the undersurface of the light path converting reflective body 24. Meanwhile, after the positioning marker 25 on the surface of the optical fiber mounting substrate and the photodiode 28 used for the monitoring of the intensity of the emitted light are mounted by the same method as that used for the VCSEL 23 and VCSEL 27, wire bonding is performed between the photodiode 28 and electrodes 38 by the same method.

Next, the VCSEL mounting substrate 21 and optical fiber mounting substrate 22 are positioned with the surface on the VCSEL mounting side and the surface on the photodiode mounting side facing each other, and are accurately aligned using the positioning marker 25 formed on the optical fiber mounting substrate 22 and the light emitting point of the VCSEL 23 mounted on the VCSEL mounting substrate 21; afterward, both substrates are caused to adhere tightly to each other, and the joining solder 39 is heated and melted, and is then cooled, so that the joining solder 39 and the joining metal thin film pattern 41 are joined and fastened together.

Figure 5:
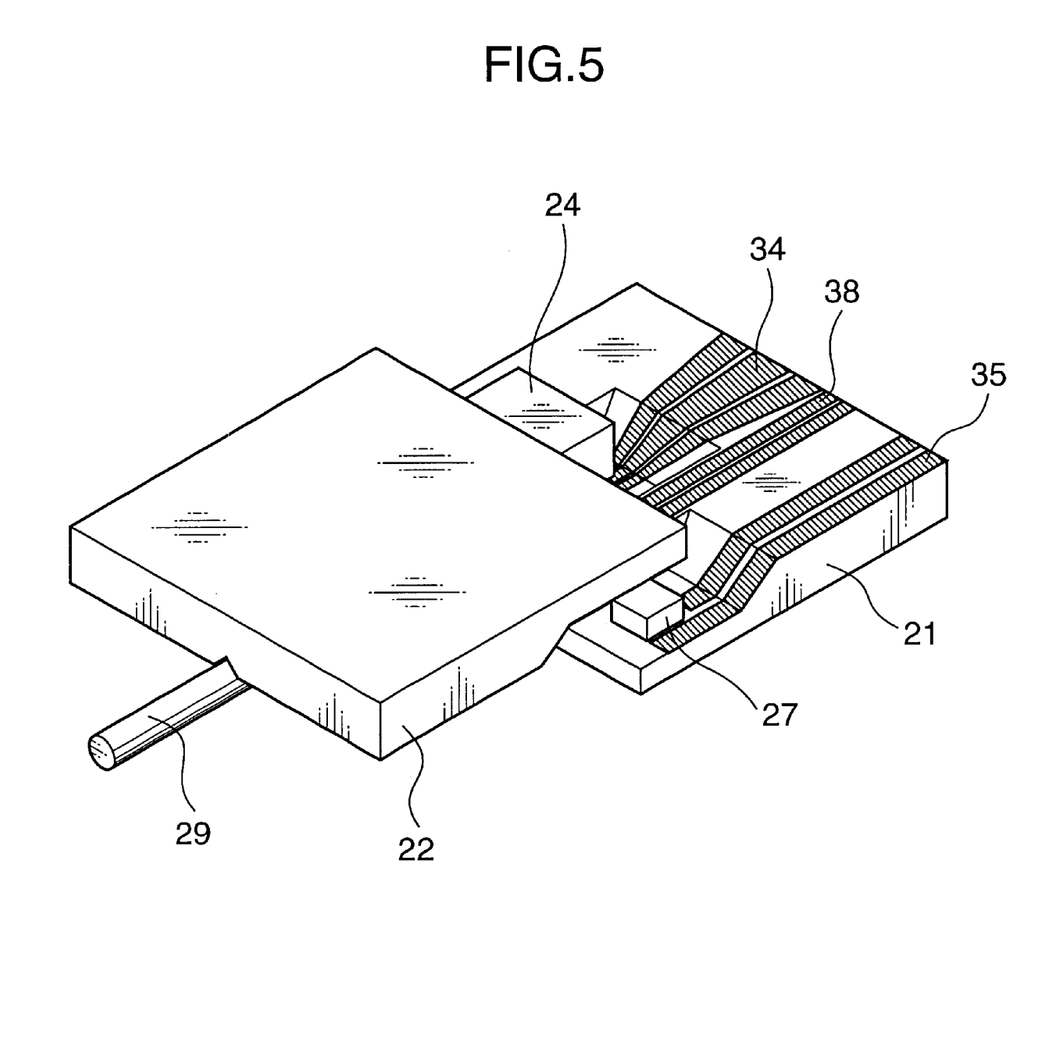
FIG. 5 is a perspective view which illustrates in model form the optical module in the present embodiment.

Finally, the optical fiber 29 is places in the optical fiber mounting groove 30 of the optical fiber mounting substrate 22. Then, after the optical fiber 29 is adjusted with respect to the direction of the optical axis (e. g., after the optical fiber 29 is caused to abut on one side surface 40 of the light path converting reflective body 24 or the like), the optical fiber is fastened in place by means of a resin or flat-plate pressing, thus completing the assembly process of the optical module (FIG. 5).

By using the optical module of the present embodiment, it is possible to make (by means of a simple structure) an accurate determination of the relative positions of the optical fiber 29 and light-emitting point of the VCSEL 23, which is necessary in order to make an optical connection between these two parts. Accordingly, effective optical connections are possible. Since the VCSEL 27 used for the monitoring of the intensity of the emitted light and the photodiode 28 are disposed facing each other, effective monitoring of the intensity of the light emitted by the VCSEL is possible.

In FIG. 4, which illustrates the abovementioned embodiment, the VCSEL 27 used for light intensity monitoring and the VCSEL 23 are formed as separate bodies; however, it would also be possible to use a VCSEL array instead of the VCSEL 23, and to use one VCSEL in the VCSEL array exclusively for the monitoring of the intensity of the emitted light. In this way, a function that is the same as that of the embodiment shown in FIG. 4 can be realized.

Figure 6:
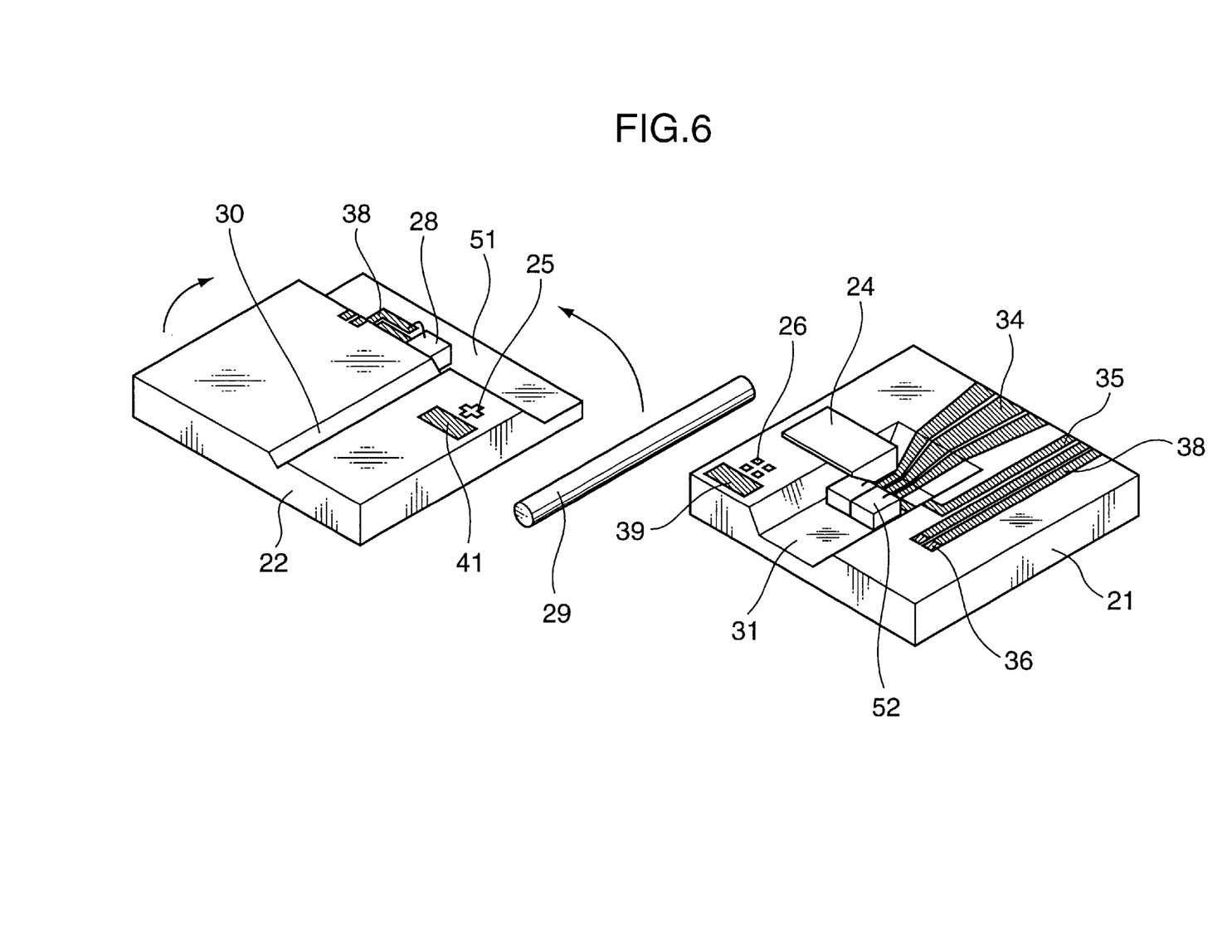
FIG. 6 is an exploded perspective view which illustrates in model form the mounting structure of the light path converting reflective body and the optical module in another embodiment.

FIG. 6 shows another embodiment of the optical module of the present invention.

Here, the basic structure is that same as that of the optical module shown in FIG. 4; however, one VCSEL in a VCSEL array 52 is used as a VCSEL that is exclusively dedicated to the monitoring of the intensity of the emitted light. On the VCSEL that is used exclusively for the monitoring of the intensity of the emitted light, this embodiment has a structure in which the light receiving surface of the photodiode 28 used for the monitoring of the intensity of the emitted light is disposed so that this light receiving surface directly faces the VCSEL emitting surface. The VCSEL array is manufactured collectively in the wafer process and, accordingly, there is very little variation in the characteristics of the individual VCSELs within the array. For this reason, it is possible to achieve even more precise monitoring of the intensity of the emitted light than is possible in the case of the optical module shown in FIG. 4, which uses a completely separate VCSEL as a VCSEL for the monitoring of the intensity of the emitted light.

Furthermore, the optical module shown in FIG. 6 has a structure in which a step surface 51 which is a low-position surface is formed on the front part of the optical fiber mounting substrate 22, and the light path converting reflective body 24 is covered by this step surface 51. Accordingly, compared to the case illustrated in FIG. 4, this structure is effective in preventing mechanical interference, and the installation space required for the light path converting reflective body 24 can be reduced. Specifically, the area of the VCSEL mounting substrate 21 can be reduced, so that the cost can be reduced. Furthermore, this embodiment is structurally simpler than the configuration shown in FIG. 4, since there is no particular need for the formation of a groove to mount the photodiode that is used to monitor the intensity of the emitted light.

Figure 7:
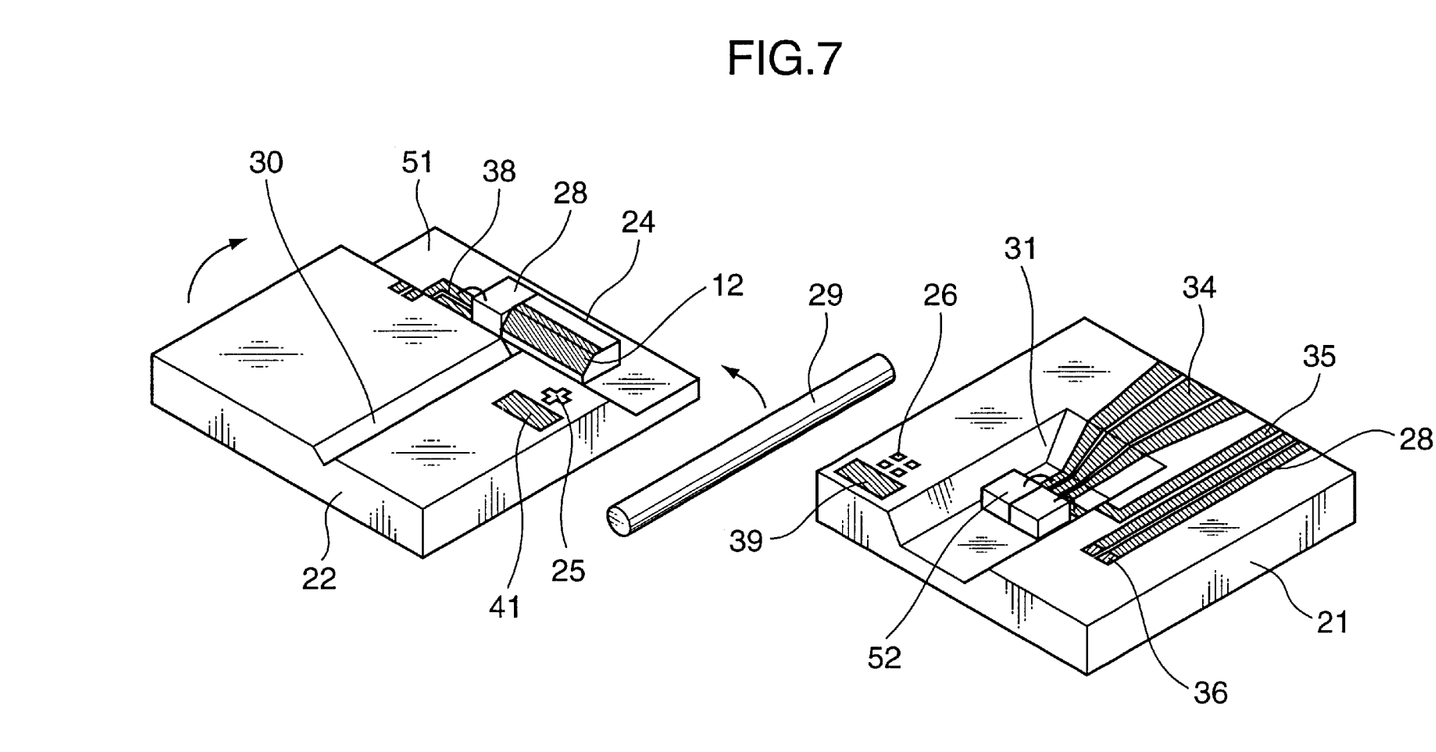
FIG. 7 is an exploded perspective view which illustrates in model form the mounting structure of the light path converting reflective body and the optical module in still another embodiment.

Furthermore, FIG. 7 shows another embodiment of the optical module of the present invention.

It is not necessary that the light path converting reflective body 24 be positioned on the side of the VCSEL mounting substrate 21; for example, this light path converting reflective body 24 may also be mounted on the optical fiber mounting substrate 22 as shown in FIG. 7. In such a case, however, the formation of a metal thin film used for joining to the back surface of the silicon wafer 11 shown in FIGS. 2A and 2C, and the formation of a thin film solder pattern (not shown in the figures) used for joining and fastening to the surface of the optical fiber mounting substrate, are necessary during the manufacture of the light path converting reflective body 24.

The optical module and mounting structure shown in FIG. 7 are effective in the following respects. Specifically, when a plurality of elements such as the abovementioned VCSEL, VCSEL used for the monitoring of the intensity of the emitted light, light path converting reflective body 24, optical fiber mounting substrate 22 and the like are mounted on the VCSEL mounting substrate 21, heating of the mounting substrate 21 is performed numerous times; however, the thermal shock that is applied to the semiconductor chip during this heating process can be reduced by mounting the light path converting reflective body 24 on the optical fiber mounting substrate 22. Furthermore, the solder pattern (not shown in the figures) used for the joining of the light path converting reflective body 24 on the surface of the VCSEL mounting substrate 21 can also be shifted to the surface of the optical fiber mounting substrate 22, so that the effect of an increased geometrical degree of freedom is also obtained.

Next, another embodiment of the optical module of the present invention will be described. It is not absolutely necessary that the VCSEL 23 be mounted on the VCSEL mounting substrate 22. Furthermore, the light path converting reflective body 24 may also be used as a VCSEL mounting carrier. Such an embodiment is shown in FIG. 8.

Figure 8:
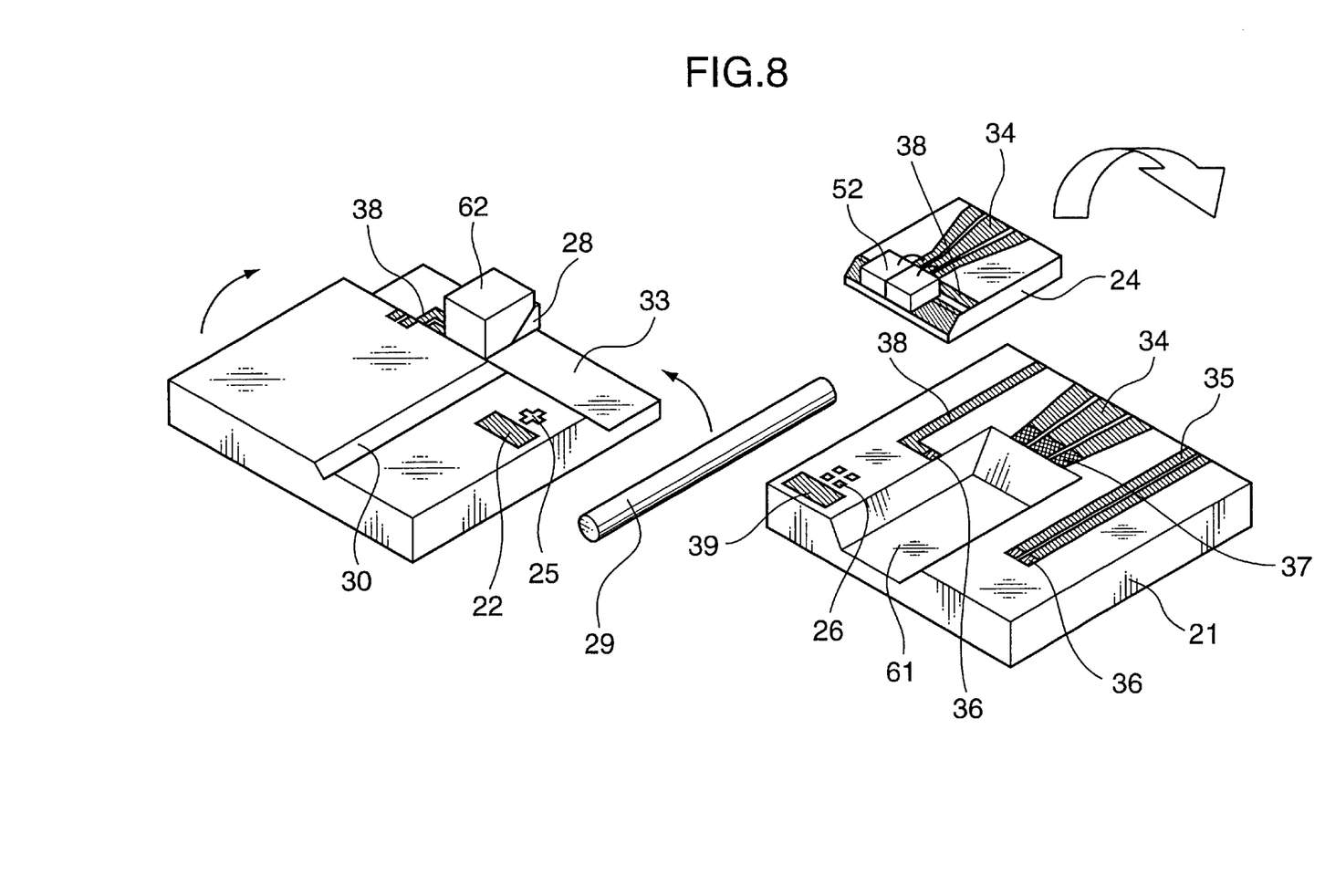
FIG. 8 is an exploded perspective view which illustrates in model form the mounting structure of the light path converting reflective body and the optical module in still another embodiment.

In the optical module and mounting structure shown in FIG. 8, electrical signal path electrodes 34 are formed in the surface layer of the light path converting reflective body 24. The VCSEL array 52 is mounted with the VCSEL light emitting surface and electrodes 34 facing each other, so that the VCSEL light emitting point is not covered by the light path converting reflective body; then, an electrical connection is established by wire bonding to the electrodes 34.

For example, the VCSEL array 52 is flip-chip mounted using a thin film solder pattern formed on the light path converting reflective body 24. The light path converting reflective body 24 is then mounted on the VCSEL mounting substrate 21 so that the electrodes 34 formed on the mounting substrate 21 and the mounting surface of the light path converting reflective body 24 for the VCSEL array 52 face each other, and these parts are joined and fastened by thins film solder or the like disposed on the mounting substrate 21. When these parts are joined and fastened, the VCSEL mounting substrate and the electrical signal electrodes 34 on the light path converting reflective body are electrically connected. On the side of the optical fiber mounting substrate, a construction is used in which one VCSEL in the VCSEL array is used exclusively to monitor the intensity of the emitted light, and the light emitted here is again subjected to a light path conversion by a light path converting reflective body 62, so that this light is caused to be incident on the photodiode 28 used to monitor the intensity of the emitted light; however, it would also be possible to form a structure in which the width of the light path converting reflective body 24 is reduced so that the light path of the light emitted by the VCSEL used exclusively for the monitoring of the intensity of the emitted light is not blocked, and to cause the emitted light to be directly incident on the photodiode that is used to monitor the intensity of the emitted light.

If the configuration shown in FIG. 8 is used, then the formation of a high-precision signal path electrode pattern into the interior of the VCSEL mounting groove shown in FIGS. 4, 5 and 6 becomes unnecessary, so that the manufacture of the signal path electrode pattern is facilitated. Furthermore, the installation of a metal wire for the purpose of electrically connecting the light emitting surface of the VCSEL (array) 23 or 52 and the light-reflecting film (reflective mirror) of the light path converting reflective body 24 becomes unnecessary, so that the effect of allowing a shortening of the light path length is also obtained.

Thus, the optical module of the present embodiment has the effect of allowing optical connections between surface light emitting elements and optical fibers by means of a simple structure; furthermore, the increase in the length of the light path caused by the mechanical interference that accompanies light path conversion can be reduced.

Furthermore, in the case of such an optical module, the reflective surface is positioned on the mounting substrate using the light emitting point of the light emitting element or the light receiving surface of the light receiving element as a reference; accordingly, extremely high-precision mounting can be realized. In addition, the geometrical degree of freedom of the optical fiber and light emitting element, and of the light receiving element and mounting substrate, is increased, so that higher-precision mounting can be realized. Moreover, monitoring of the emitted light from the surface light emitting element can be effectively performed while realizing a more compact size and lower height.

In all of the abovementioned examples, a mechanism for monitoring the intensity of the light emitted by the VCSEL was installed. However, such a VCSEL is inherently superior in terms of ambient temperature environment characteristics, and the reliability of the element is also superior in structural terms. Accordingly, this monitoring mechanism is not absolutely necessary. Of course, the present invention is also effective in cases where this monitoring mechanism is omitted.

Furthermore, the various configurations shown in the present embodiment may be appropriately combined. Moreover, in the present embodiment, an optical system based on one optical fiber was envisioned; in principle, however, this can easily be expanded in the case of an optical module using a plurality of optical fibers (VCSEL array), and the present invention is also effective in such cases.

The present invention will be described below in terms of more concrete examples.

In FIG. 2, a single-crystal silicon wafer was used as 11. The silicon wafer 11 used was a wafer in which the face orientation was inclined by 9.7° from (100), as shown in FIG. 3. The V grooves 14 shown in FIG. 2 were formed rectilinearly along the (110) direction shown in FIG. 3. The formation of the V grooves 14 was accomplished using a photolithographic technique and anisotropic etching technique in the same manner as in the formation of the mounting substrate.

Since this wafer was worked so that the face orientation was inclined by 9.7° from (100), the angle θ in FIG. 2 was 45°. After the working that formed the V grooves was performed, a metal thin film with a thickness of approximately 1 μm was formed on the inclined faces used as reflective mirrors. Some other metal thin film with a metallic luster could also be used as this metal thin film; however, Au with a high reflectivity was used. As the underlying metal thin film was Cr which has good adhesion properties with an $SiO_2$ film formed on the silicon substrate using thermal oxidation. Positioning markers 23 were formed at the time that the reflective mirrors were formed. After the formation of the V grooves and the formation of the metal thin film pattern were completed, the wafer was divided into individual reflective mirror elements by cutting the wafer into elements with an appropriate size.

In FIG. 4, single-crystal silicon was used for the VCSEL mounting substrate. The trapezoidal grooves 31 and 32 used for mounting were formed using a photolithographic technique and an anisotropic etching technique utilizing an aqueous solution of an alkali. The dimensions of the trapezoidal groove 31 used for mounting are determined by the thickness of the VCSEL element and the length of the light path between the VCSEL 23 and the optical fiber 29; however, in order to prevent mechanical interference with the light path converting reflective body, a depth that is greater than the minimum thickness of the VCSEL 23 is necessary. Accordingly, this depth of the trapezoidal groove 31 was set at approximately 400 μm. It is not absolutely necessary that the depth of the trapezoidal groove 32 used for mounting be the same as the depth of the trapezoidal groove 31 used for mounting; however, in order to simplify the etching process, this depth was made the same as the depth of the trapezoidal groove 31 used for mounting. The width of the trapezoidal grooves 31 and 32 used for mounting may be any width that is sufficient to allow the mounting of the VCSELs 23 and 27 and, accordingly, this width was set at approximately 1500 μm. The positioning markers 26 were formed by metal thin film patterns using a photolithographic process and a vacuum evaporation process. Electrical signal paths 34, a current supply path 35 and an emitted light intensity monitoring signal path 39 were formed in the surface layer of the substrate. Thin film solder 36 and 37 are used for joining the VCSEL mounting substrate to the optical fiber mounting substrate. The electrical paths were formed by metal thin film patterns, and consisted (for example) of an upper layer/lower layer, e. g., Au/Cr, or Au/Pt/Ti. The thickness of these electrical paths was set at several thousand angstroms. The solder parts were formed by a solder material such as AuSn or the like, and had a thickness of 1 to several microns.

Single-crystal silicon was used as the base material of the optical fiber mounting substrate 22. A V groove 30 used to mount (position) the optical fiber, which was formed using a silicon anisotropic etching technique in the same manner as described above, and a positioning marker 25, were formed in the surface layer of the optical fiber mounting substrate 22. The positioning marker 25 was formed so that a sufficient positional precision was ensured with respect to the V groove 30. Furthermore, a photodiode mounting groove 33 was formed in the surface layer of the mounting substrate 22, and this groove 33 was formed with a sufficient depth and width in accordance with the size of the photodiode element, in the same manner as the groove 32 in the surface of the VCSEL mounting substrate.

The details of the method used to manufacture the light path converting reflective body 24 were as described above; this was formed as a reflective mirror with a metal film on the inclined face. Since the reflective inclined face is manufactured using an anisotropic etching technique, a reflective mirror inclined face that is superior in terms of flatness in conformity with the crystal orientation can be obtained. The size of the light path converting reflective body 24 can be freely set in the range of several hundred microns to several millimeters; in this case, the size was set at 1 mm. 29 indicates a quartz type optical fiber. A metal thin film pattern 39 used for joining of the emitted light intensity monitoring signal path 38 and VCSEL mounting substrate was also formed on the surface of the substrate 21.

In both the VCSEL mounting substrate 21 and optical fiber mounting substrate 22, an $SiO_2$ oxide film (not shown in the figures) was formed as the lowermost layer of the surface layer, so that the silicon substrate and upper metal thin film pattern were completely electrically insulated from each other.

Next, the method used to assembly an optical module using the abovementioned VCSEL, VCSEL used for the monitoring of the emitted light intensity, photodiode used for the monitoring of the emitted light, VCSEL mounting substrate, optical fiber mounting substrate, reflective mirror element and optical fiber will be described.

In the VCSEL mounting substrate, the VCSEL 3 was mounted on the mounting substrate 21 using the markers 26. In this mounting, the markers 26 and the mounting surface of the VCSEL 23 were caused to face each other, the relative positions of the markers 26 and VCSEL 23 were detected by inserting an observational optical system between the respective parts, and the parts were aligned. Following the completion of this alignment, the observational optical system was withdrawn, and the mounting substrate 21 and VCSEL 23 were pressed tightly together; afterward, the thin film solder formed on the mounting substrate (not shown in the figures) was melted and then cooled, so that the VCSEL 23 was joined and fastened to the VCSEL mounting substrate 21. In this case, positioning is performed using the undersurface (mounting surface) of the VCSEL 23; however, high-precision positioning is generally difficult because of chipping of the outer circumferential parts of the back surface of the chip and the like. In actuality, there is no great need for mounting precision in this case; a precision of several tens of microns to 100 microns is sufficient. The VCSEL 27 used for the monitoring of the intensity of the emitted light was mounted by a similar method. Following the mounting of the VCSEL 27, wire bonding was performed in order to establish electrical connections between the VCSELs 23 and 27 and the electrical paths 34 and 35. Then, the mounting of the light path converting reflective body 24 was performed. In the mounting of this light path converting reflective body 24, a mounting precision of several microns is required; accordingly, positioning using the positioning markers 26 is unsuitable. High-precision mounting can be achieved by performing this positioning using the light emitting point of the VCSEL 23 and the positioning markers (not shown in the figures) of the light path converting reflective body 24. The joining of the light path converting reflective body 24 and the VCSEL mounting substrate 21 was accomplished using solder (not shown in the figures) disposed on the mounting substrate 1.

Meanwhile, in the optical fiber mounting substrate 22, the photodiode 28 was mounted and fastened to the mounting substrate 22 by the same method as that used for the mounting of the VCSEL 27 used for the monitoring of the intensity of the emitted light.

Next, the optical fiber mounting substrate 22 was mounted on the VCSEL mounting substrate 21 on which the VCSEL, photodiode 28 and the like had been mounted. The VCSEL mounting surface of the VCSEL mounting substrate 21 and the photodiode mounting surface of the optical fiber mounting substrate 22 were caused to face each other, and the positioning marker 25 on the optical fiber mounting substrate 22 and the light emitting point of the VCSEL 23 on the VCSEL mounting substrate 21 were aligned. Then, after both substrates were pressed tightly together, a soldering connection of the thin film solder 36 on the VCSEL mounting substrate 21 and the metal pattern 29 on the mounting substrate 22 was performed, so that the two substrates were joined and fastened together. In this case, the system was arranged so that the output light monitoring signal path 38 of the photodiode 28 and the lead-out path on the side of the VCSEL mounting substrate 21 were electrically connected via the solder 37.

Finally, The optical fiber 29 was mounted in the mounting V groove 30, and the fiber was caused to abut the abutting surface 40. Then, for example, the optical fiber 29 was fastened in place by mean of a plate made of a resin,glass or the like, thus completing the optical module.

In the optical module of the present embodiment, a good optical connection between the VCSEL and the optical fiber can be obtained by means of a simple structure; furthermore, a practical VCSEL emitted light intensity monitoring structure is realized. Moreover, since the light path converting reflective body can be formed as part of a group by means of a wafer process, a low-cost light path converting reflective body can be realized, so that a low-cost optical module can be realized.

Thus, the optical module of the present invention comprises a surface light emitting element and a light path converting reflective body that has an inclined face on which a light-reflecting film is formed, and that consists of single-crystal silicon, wherein the light that is emitted from the surface light emitting element is subjected to light path conversion by the inclined face.

In the case of such an optical module, since the light path converting reflective body is manufactured by the working of a silicon wafer, manufacture as a group by means of a wafer process is possible, so that a great reduction in cost can be achieved. Furthermore, since the angle of inclination of the light path converting reflective body can be arbitrarily determined in accordance with the orientation of the wafer surface, this has the effect of making any desired angle of inclination possible; specifically, an optical system on which the emitted light from the surface light emitting element is efficiently caused to be incident, or an optical system which efficiently causes the emitted light from the surface light emitting element to be incident on a light receiving element, can be provided.

Furthermore, the inclined face may also be formed using (for example) anisotropic etching. Furthermore, for example, such an optical module may be further equipped with a substrate on which a high-position surface and a low-position surface with different heights are formed, and the surface light emitting element and light path converting reflective body are respective disposed on the respective surfaces. Furthermore, for example, it would also be possible to provide an upper substrate in which a groove used to install a light-transmitting body is formed, and to cause light from the surface light emitting element to be incident on this light-transmitting body. Furthermore, for example, it would also be possible to install a monitoring surface light emitting element and a monitoring light receiving element used to monitor the emitted light from the surface light emitting element on an upper substrate and lower substrate, respectively.

This application is based on patent application No.2001-99412 and No.2001-332132 filed in Japan, the contents of which are hereby incorporated by references.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds are therefore intended to embraced by the claims.

What is claimed is:

1. An optical module comprising:

a surface light emitting element;

a light path converting reflective body formed from single-crystal silicon, and having an inclined face on which a light-reflecting film is formed;

a lower substrate on which a low-position surface and a high-position surface that have different heights are formed; and an upper substrate in which a groove is formed;

wherein said surface light emitting element and said light path converting reflective body are optically coupled such that light emitted from said surface light emitting element is subjected to a light path conversion by said light-reflecting film on said inclined face;

wherein said surface light emitting element is in a groove and below said light path converting reflective body;

wherein said surface light emitting element is disposed on said low-position surface, said light path converting reflective body is disposed on said high-position surface, a light-transmitting body is disposed in said groove, and said upper substrate is joined to said lower substrate so that the light from said surface light emitting element, the light path of which has been converted by said light path converting reflective body, is caused to incident on said light-transmitting body.

2. The optical module according to claim 1, wherein said inclined face consists of a plane that is inclined with respect to a (100) plane of said single crystal silicon and is formed using anisotropic etching.

3. The optical module according to claim 1, wherein said inclined face is formed using anisotropic etching.

4. The optical module according to claim 1, wherein said inclined face is formed so that the incident light is subjected to a light path conversion at an angle of 90°.

5. The optical module according to claim 1, wherein a monitoring surface light emitting element which is used to monitor the light emitted by said surface light emitting element is disposed on said lower substrate, and a monitoring light receiving element which monitors the light emitted by said monitoring surface light emitting element is disposed on said upper substrate.

6. The optical module according to claim 1, wherein different heights are formed in said upper substrate so that said light path converting reflective body can be accommodated.

7. An optical module comprising:

a surface light emitting element;

a light path converting reflective body formed from single-crystal silicon, and having an inclined face on which a light-reflecting film is formed;

a lower substrate on which a low-position surface and a high-position surface that have different heights are formed; and an upper substrate in which a groove is formed;

wherein said surface light emitting element and said light path converting reflective body are optically coupled such that light emitted from said surface light emitting element is subjected to a light path conversion by said light-reflecting film on said inclined face;

wherein said surface light emitting element is in a groove and below said light path converting reflective body;

wherein said surface light emitting element is a surface light emitting element array that has a plurality of light emitting elements;

said surface light emitting element array is disposed on said low-position surface, and said light path converting reflective body is disposed on said high-position surface;

a light-transmitting body is disposed in said groove, and a light receiving element is disposed on a surface in which a groove is formed; and said upper substrate is joined to said lower substrate so that the light from one of the light emitting elements of said surface light emitting element array, the light path of which has been converted by said light path converting reflective body, is caused to be incident on said light-transmitting body, and so that the light from another of the light emitting elements of said surface light emitting element array is caused to be incident on said light receiving element.

* * * * *